US012362539B2

(12) United States Patent
Kurita et al.

(10) Patent No.: US 12,362,539 B2
(45) Date of Patent: Jul. 15, 2025

(54) LASER DEVICE, AND LASER WAVEFORM CONTROL METHOD

(71) Applicant: HAMAMATSU PHOTONICS K.K., Hamamatsu (JP)

(72) Inventors: Takashi Kurita, Hamamatsu (JP); Yoshinori Kato, Hamamatsu (JP); Toshiyuki Kawashima, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 807 days.

(21) Appl. No.: 17/274,672

(22) PCT Filed: Jul. 2, 2019

(86) PCT No.: PCT/JP2019/026351
§ 371 (c)(1),
(2) Date: Mar. 9, 2021

(87) PCT Pub. No.: WO2020/059247
PCT Pub. Date: Mar. 26, 2020

(65) Prior Publication Data
US 2021/0273407 A1    Sep. 2, 2021

(30) Foreign Application Priority Data
Sep. 21, 2018    (JP) .................................. 2018-177894

(51) Int. Cl.
*H01S 5/0683*    (2006.01)
*H01S 3/10*    (2006.01)
(Continued)

(52) U.S. Cl.
CPC ........ *H01S 5/0683* (2013.01); *H01S 3/10015* (2013.01); *H01S 3/2375* (2013.01);
(Continued)

(58) Field of Classification Search
CPC ............... H01S 5/0683; H01S 3/10015; H01S 5/06216; H01S 5/06835; H01S 5/0085;
(Continued)

(56) References Cited

U.S. PATENT DOCUMENTS 5,619,321 A *  4/1997  Artiglia ................ G01M 11/332
                                                 356/73.1
5,933,271 A *  8/1999  Waarts ................ H01S 3/13013
                                                 359/345
(Continued)

FOREIGN PATENT DOCUMENTS

CN         1190298 A *   8/1998    ........... H01S 3/1301
CN       101983421 A      3/2011
(Continued)

OTHER PUBLICATIONS

Hjalmarsson et al., "Iterative Feedback Tuning: Theory and Applications", Aug. 31, 1998, IEEE Control Systems Magazine, vol. 18, No. 4, 26-41. (Year: 1998).*
(Continued)

*Primary Examiner* — Joshua King
(74) *Attorney, Agent, or Firm* — Faegre Drinker Biddle & Reath LLP

(57) ABSTRACT

A laser apparatus includes a semiconductor laser element, a waveform calculation unit for calculating input waveform data, a driver circuit for supplying a drive current having a temporal waveform according to the input waveform data to the semiconductor laser element, an optical amplifier for amplifying laser light output from the semiconductor laser element, and a light waveform detection unit for detecting a waveform of laser light after the amplification output from the optical amplifier. The waveform calculation unit compares the waveform of the laser light after the amplification detected by the light waveform detection unit with a target waveform, adjusts a temporal waveform of the input wave-
(Continued)

form data, and brings the waveform of the laser light after the amplification close to the target waveform.

5 Claims, 12 Drawing Sheets

(51) Int. Cl.
  *H01S 3/13* (2006.01)
  *H01S 3/23* (2006.01)
  *H01S 5/00* (2006.01)
  *H01S 5/062* (2006.01)
(52) U.S. Cl.
  CPC ...... *H01S 5/06216* (2013.01); *H01S 5/06246* (2013.01); *H01S 5/06835* (2013.01); H01S 3/1003 (2013.01); H01S 3/1301 (2013.01); H01S 5/0064 (2013.01); H01S 5/0085 (2013.01); H01S 2301/08 (2013.01)
(58) Field of Classification Search
  CPC ....... H01S 3/1301–1302; H01S 3/2375; H01S 2301/08
  See application file for complete search history.

(56) References Cited

U.S. PATENT DOCUMENTS

| | | | | |
|---|---|---|---|---|
| 6,061,170 A * | 5/2000 | Rice | ............ | H01S 3/06716 359/347 |
| 6,304,353 B1 * | 10/2001 | Gehlot | ............ | H04B 10/532 398/9 |
| 6,480,318 B2 * | 11/2002 | Mori | ............ | H04B 10/0731 356/73.1 |
| 6,741,763 B1 * | 5/2004 | Taylor | ............ | H04B 10/25137 359/279 |
| 6,900,929 B2 * | 5/2005 | Minakawa | ............ | H01S 3/10015 356/73.1 |
| 7,466,730 B2 * | 12/2008 | Sekita | ............ | H01S 3/235 372/29.01 |
| 7,742,511 B2 * | 6/2010 | Murison | ............ | H01S 3/06758 372/99 |
| 2004/0032646 A1 * | 2/2004 | Koren | ............ | H01S 5/5018 359/344 |
| 2004/0240044 A1 | 12/2004 | Park et al. | | |
| 2005/0036525 A1 * | 2/2005 | Liu | ............ | H01S 3/0941 372/6 |
| 2007/0053391 A1 * | 3/2007 | Oron | ............ | H01S 5/50 372/29.01 |
| 2008/0298417 A1 * | 12/2008 | Atkins | ............ | H04B 10/2914 372/50.22 |
| 2009/0022189 A1 * | 1/2009 | Okuno | ............ | G02F 1/3513 372/25 |
| 2009/0067455 A1 | 3/2009 | Murison et al. | | |
| 2009/0110012 A1 * | 4/2009 | Tokuhisa | ............ | H01S 3/2375 372/21 |
| 2009/0245302 A1 * | 10/2009 | Baird | ............ | H01S 3/102 372/25 |
| 2010/0220756 A1 * | 9/2010 | Krzysztof | ............ | H01S 3/235 372/50.22 |
| 2011/0142084 A1 * | 6/2011 | Reid | ............ | H01S 5/4006 372/20 |
| 2011/0170564 A1 * | 7/2011 | Desbiens | ............ | H01S 3/0092 372/6 |
| 2011/0298156 A1 * | 12/2011 | Hooper | ............ | B23K 26/0622 264/400 |
| 2012/0106579 A1 * | 5/2012 | Roos | ............ | H01S 5/0683 372/20 |
| 2012/0206427 A1 * | 8/2012 | Yamamuro | ............ | G03B 21/2053 345/207 |
| 2012/0250707 A1 * | 10/2012 | Lu | ............ | B23K 26/389 372/25 |
| 2013/0148674 A1 * | 6/2013 | Nowak | ............ | H01S 3/2316 372/26 |
| 2013/0183046 A1 * | 7/2013 | Blanchette | ............ | H01S 3/10015 398/186 |
| 2013/0208745 A1 * | 8/2013 | Sjolund | ............ | H01S 5/02325 372/34 |
| 2014/0036944 A1 * | 2/2014 | Tokuhisa | ............ | H01S 3/06754 372/29.015 |
| 2014/0185643 A1 * | 7/2014 | McComb | ............ | H01S 3/06754 372/75 |
| 2015/0043599 A1 * | 2/2015 | Yanagida | ............ | H01S 3/1118 372/18 |
| 2016/0172819 A1 * | 6/2016 | Ogaki | ............ | H01S 3/1001 372/6 |
| 2016/0197451 A1 * | 7/2016 | Kraemer | ............ | H01S 3/094076 372/25 |
| 2016/0240993 A1 * | 8/2016 | Tokuhisa | ............ | G02F 1/353 |
| 2016/0344158 A1 * | 11/2016 | Onose | ............ | H01S 3/10015 |
| 2017/0027047 A1 * | 1/2017 | Yanagida | ............ | H01S 3/0602 |
| 2018/0323567 A1 * | 11/2018 | Wada | ............ | H01S 3/10015 |
| 2018/0323569 A1 * | 11/2018 | Shibata | ............ | H01S 3/0057 |
| 2019/0305504 A1 * | 10/2019 | Goodno | ............ | H01S 3/1306 |
| 2020/0346301 A1 * | 11/2020 | Yao | ............ | B23K 26/0604 |

FOREIGN PATENT DOCUMENTS

| | | | | |
|---|---|---|---|---|
| CN | 104094484 A | | 10/2014 | |
| CN | 106229802 A | * | 12/2016 | ............ H01S 3/0057 |
| DE | 102017114399 A1 | * | 1/2019 | ......... B23K 26/0622 |
| EP | 0828174 A2 | * | 9/2011 | |
| EP | 2363927 A2 | * | 9/2011 | ......... H01S 3/06754 |
| EP | 3553902 A1 | | 10/2019 | |
| EP | 3557704 A1 | | 10/2019 | |
| JP | 55133588 A | * | 10/1980 | |
| JP | 06077573 A | * | 3/1994 | ............ H01S 3/1301 |
| JP | H8-181371 A | | 7/1996 | |
| JP | 2012138421 A | * | 7/2012 | |
| JP | 2014-232746 A | | 12/2014 | |
| JP | 2015-503856 A | | 2/2015 | |
| JP | 2016102811 A | * | 6/2016 | ............ H01S 3/1301 |
| JP | 2018-098449 A | | 6/2018 | |
| KR | 101725620 B1 | * | 4/2017 | |
| WO | WO-2004098003 A1 | * | 11/2004 | ............ B23K 26/064 |
| WO | WO-2012135036 A2 | * | 10/2012 | ......... B23K 26/0622 |
| WO | WO-2013/106140 A1 | | 7/2013 | |
| WO | WO-2013106456 A1 | * | 7/2013 | ............ G02F 1/353 |
| WO | WO-2018100579 A1 | * | 6/2018 | ......... H01S 3/06754 |
| WO | WO-2018105082 A1 | * | 6/2018 | ............... H01S 3/10 |
| WO | WO-2018105733 A1 | * | 6/2018 | ......... H01S 3/10015 |
| WO | WO-2018110222 A1 | * | 6/2018 | ............ H01S 3/0078 |
| WO | WO-2018134971 A1 | * | 7/2018 | ......... H01S 3/10007 |

OTHER PUBLICATIONS

Saumyabrata Banerjee et al., "100 J-level nanosecond pulsed diode pumped solid state laser", Optics Letters, vol. 41 No. 9, 2016, p. 2089-p. 2092.
International Preliminary Report on Patentability mailed Apr. 1, 2021 for PCT/JP2019/026351.

* cited by examiner

LASER DEVICE, AND LASER WAVEFORM CONTROL METHOD

TECHNICAL FIELD

The present disclosure relates to a laser apparatus and a laser waveform control method.

BACKGROUND ART

Non Patent Document 1 discloses a laser apparatus that outputs a light pulse having a pulse width on the order of nanoseconds. The above laser apparatus has a light source that outputs laser light which is continuous (CW) light, an acousto-optical modulator (AOM) that temporally cuts the laser light output from the light source and makes it into pulsed light, and an electro-optical modulator (EOM) that shapes the pulsed light output from the AOM into arbitrary waveform. The light source is a laser diode (LD) pumped fiber laser.

CITATION LIST

Non Patent Literature

Non Patent Document 1: Saumyabrata Banerjee et al., "100 J-level nanosecond pulsed diode pumped solid state laser", Optics Letters, Vol. 41 No. 9, pp. 2089-2092 (2016)

SUMMARY OF INVENTION

Technical Problem

Arbitrary shaping of a temporal waveform of ultrashort pulsed light or short pulsed light is extremely useful for, for example, laser processing and various measurement devices (for example, shape monitor, shock wave monitor). This is because improvement in processing accuracy and measurement accuracy can be expected by selecting an appropriate waveform of pulsed light according to a processing object or a measurement object. However, there is a problem that even when a desired waveform is generated with high accuracy, when optical amplification is performed in order to obtain a required pulsed light intensity, a light waveform after the amplification is distorted due to the non-linearity of the optical amplifier. Therefore, it is conceivable that, in consideration of the non-linearity of the optical amplifier in advance, pulsed light having a waveform with which a light waveform after amplification becomes a desired shape is input to the optical amplifier.

A conventional pulsed light generation device, for example, as described in Non Patent Document 1, shapes continuous light output from a fiber laser or a solid-state laser into an arbitrary waveform by the EOM. Since the sizes of the fiber laser and the solid-state laser tend to become large, and further, the EOM has large fluctuations in characteristics (temperature drift) due to temperature changes, a configuration for compensating for the temperature drift of the EOM is separately required. These are factors that hinder the size reduction of the laser apparatus.

An object of the present invention is to provide a laser apparatus and a laser waveform control method capable of reducing an apparatus size.

Solution to Problem

An embodiment of the present invention is a laser apparatus. The laser apparatus includes a semiconductor laser element; a waveform calculation unit for calculating input waveform data; a driver circuit electrically connected to the waveform calculation unit and the semiconductor laser element, and for generating a drive current having a temporal waveform according to the input waveform data, and supplying the drive current to the semiconductor laser element; an optical amplifier optically coupled to the semiconductor laser element, and for amplifying light output from the semiconductor laser element; and a light waveform detection unit for detecting a light waveform after the amplification output from the optical amplifier, and the waveform calculation unit compares the light waveform after the amplification detected by the light waveform detection unit with a target waveform, adjusts a temporal waveform of the input waveform data, and brings the light waveform after the amplification close to the target waveform.

An embodiment of the present invention is a laser waveform control method. The laser waveform control method includes a current supply step of generating a drive current having a temporal waveform according to input waveform data, and supplying the drive current to a semiconductor laser element; an optical amplification step of amplifying light output from the semiconductor laser element; a light waveform detection step of detecting a light waveform after the amplification; and a waveform adjustment step of comparing the light waveform after the amplification detected by the light waveform detection step with a target waveform, adjusting a temporal waveform of the input waveform data, and bringing the light waveform after the amplification close to the target waveform.

In the above laser apparatus and the laser waveform control method, a fiber laser or a solid-state laser that outputs continuous light is not used, and the semiconductor laser element is used as a light source. Further, a waveform of a drive signal for driving the semiconductor laser element is adjusted on the basis of the light waveform after the amplification which is detected by the light waveform detection unit (light waveform detection step). Thus, the light waveform output from the semiconductor laser element can be adjusted to bring the light waveform after the amplification close to the target waveform.

Further, the sizes of an electronic circuit such as the waveform calculation unit and the semiconductor laser element are much smaller than the sizes of a fiber laser, a solid-state laser, and an EOM. In addition, as for the temperature drift of the semiconductor laser element, it is sufficient to keep the temperature of the semiconductor laser element constant by a Peltier element or the like. From the above, according to the above laser apparatus and laser waveform control method, it is possible to reduce an apparatus size as compared with a conventional apparatus and method.

Advantageous Effects of Invention

According to the embodiments of the present invention, it is possible to provide a laser apparatus and a laser waveform control method capable of reducing an apparatus size.

DESCRIPTION OF EMBODIMENTS

Hereinafter, embodiments of a laser apparatus and a laser waveform control method will be described in detail with reference to the accompanying drawings. In the description of the drawings, the same elements will be denoted by the same reference signs, and redundant description will be omitted.

Figure 1:
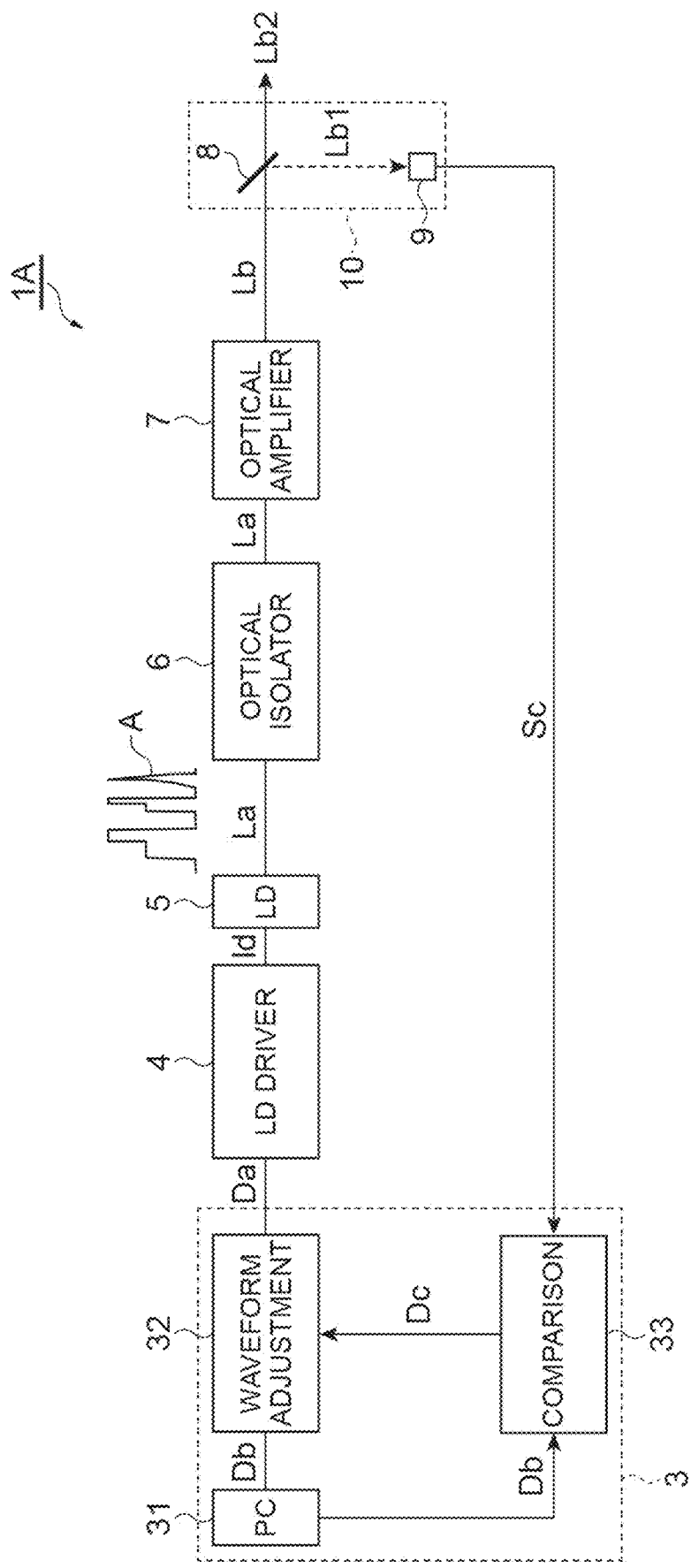
FIG. 1 is a block diagram illustrating a configuration of a laser apparatus 1A according to an embodiment.

FIG. 1 is a block diagram illustrating a configuration of a laser apparatus 1A according to an embodiment. As illustrated in FIG. 1, the laser apparatus 1A of the present embodiment includes a waveform calculation unit 3, a driver circuit 4, a semiconductor laser element 5, an optical isolator 6, an optical amplifier 7, an optical branch unit 8, and a photodetection unit 9.

The waveform calculation unit 3 includes an electronic circuit, and is electrically connected to the driver circuit 4. The waveform calculation unit 3 calculates and generates input waveform data Da for bringing a waveform of a light pulse output from the optical amplifier 7 (hereinafter referred to as output waveform) close to a target waveform, and provides the input waveform data Da to the driver circuit 4. In one example, the waveform calculation unit 3 includes a computer 31, a waveform adjustment unit 32, and a comparison unit 33. The computer 31 has a CPU and a memory, and operates according to a program stored in the memory.

The memory of the computer 31 is a storage unit in the present embodiment, and stores a desired (arbitrary) light waveform, that is, data representing the target waveform (hereinafter, referred to as target waveform data) in advance. The target waveform data is stored in the memory in advance by an operator through a data input terminal of the computer 31 before the operation of the laser apparatus 1A. Further, the computer 31 may design the target waveform by itself as a waveform design unit. That is, the computer 31 may calculate a target waveform for achieving light irradiation conditions (processing conditions, observation conditions) given from the outside. Target waveform data representing the calculated target waveform is stored in the memory of the computer 31.

The comparison unit 33 is electrically connected to the photodetection unit 9 to be described later, and acquires an output waveform on the basis of a detection signal (light intensity signal Sc) obtained from the photodetection unit 9. Further, the comparison unit 33 is electrically connected to the computer 31, and acquires the target waveform data Db from the computer 31. The comparison unit 33 compares the output waveform with the target waveform, and sends difference data Dc representing the difference to the waveform adjustment unit 32.

In addition, the comparison unit 33 may include a computer having a CPU and a memory. In that case, the comparison unit 33 may be provided separately from the computer 31, or may be achieved in a computer in common with the computer 31.

The waveform adjustment unit 32 is electrically connected to the computer 31, and acquires the target waveform data Db from the computer 31. Further, the waveform adjustment unit 32 is electrically connected to the comparison unit 33, and acquires the difference data Dc output from the comparison unit 33. The waveform adjustment unit 32 generates the input waveform data Da so that the output waveform approaches the target waveform (that is, the difference becomes small) on the basis of the data Db and Dc.

In addition, the waveform adjustment unit 32 also may include a computer having a CPU and a memory. In that case, the waveform adjustment unit 32 may be provided separately from the computer 31 and the comparison unit 33, or may be achieved in a computer in common with at least one of the computer 31 and the comparison unit 33.

An input end of the driver circuit 4 is electrically connected to the waveform adjustment unit 32 of the waveform calculation unit 3, and receives the input waveform data Da from the waveform adjustment unit 32. The driver circuit 4 generates a drive current Id having a temporal waveform according to the input waveform data Da. An output end of the driver circuit 4 is electrically connected to the semiconductor laser element 5, and supplies the generated drive current Id to the semiconductor laser element 5. In addition, in some cases, a bias current having a constant magnitude that does not change with time is superimposed on the drive current Id.

The semiconductor laser element 5 is a laser diode, and is electrically connected to the driver circuit 4. The driver circuit 4 supplies the drive current Id to any one of a cathode and an anode of the semiconductor laser element 5. The semiconductor laser element 5 receives the drive current Id and generates laser light La. The laser light La is light before amplification by the optical amplifier 7, and has a temporal waveform according to the input waveform data Da.

In one example, the semiconductor laser element 5 is a distributed feedback (DFB) laser diode. When the semiconductor laser element 5 is a DFB laser diode, optimization is easily possible according to the wavelength characteristics of the gain of the optical amplifier 7. In addition, a waveform A in the figure schematically illustrates a temporal waveform of the laser light La output from the semiconductor laser element 5. The output power of the semiconductor laser element 5 is, for example, several nanojoules.

A light input end of the optical isolator 6 is optically coupled to a laser light output end of the semiconductor laser element 5. Further, a light output end of the optical isolator 6 is optically coupled to a light input end of the optical amplifier 7. That is, the optical isolator 6 is interposed on an optical path between the semiconductor laser element 5 and the optical amplifier 7. The optical isolator 6 prevents light amplified by the optical amplifier 7 from returning to the semiconductor laser element 5.

The light input end of the optical amplifier 7 is optically coupled to the semiconductor laser element 5 via the optical isolator 6 to amplify the laser light La output from the semiconductor laser element 5. The optical amplifier 7 does not convert the laser light into an electric signal, and directly amplifies the light as it is. The optical amplifier 7 may include, for example, an optical fiber amplifier, a solid-state laser amplifier, or a combination thereof.

The optical fiber amplifier has an optical fiber made of glass with added impurities such as Er and Yb, and amplifies the laser light La by excitation light being input to the optical fiber with the laser light La. Further, the solid-state laser amplifier may include glass or yttrium aluminum garnet (YAG) with added impurities such as Nd. The solid-state laser amplifier amplifies the laser light La by excitation light being input with the laser light La. The gain of the optical amplifier 7 is, for example, in the range of 3 to 30 dB.

The optical branch unit 8 and the photodetection unit 9 constitute a light waveform detection unit 10. The light waveform detection unit 10 detects the light waveform after the amplification which is output from the optical amplifier 7. The optical branch unit 8 is optically coupled to a light output end of the optical amplifier 7. The optical branch unit 8 reflects (or transmits) a part Lb1 of the laser light Lb after the amplification which is output from the optical amplifier 7 and transmits (or reflects) a remaining part Lb2, thereby branching the part Lb1 of the laser light Lb after the amplification. The optical branch unit 8 may include, for example, a glass plate.

A ratio (branch ratio) P1/P2 of an intensity P1 of the part Lb1 of the laser light Lb and an intensity P2 of the remaining part Lb2 is, for example, in the range of 0.005 to 0.01. The photodetection unit 9 is optically coupled to the optical branch unit 8, and receives the part Lb1 of the laser light Lb after the amplification. In addition, the remaining part Lb2 of the laser light Lb is output to the outside of the laser apparatus 1A, and used for laser processing, various measurements, and the like.

The photodetection unit 9 generates the light intensity signal Sc being an electric signal according to the light intensity of the part Lb1 of the laser light Lb, and provides the light intensity signal Sc to the comparison unit 33. In one example, the photodetection unit 9 may be configured by including a photodiode and a circuit that converts a photocurrent flowing through the photodiode into a voltage signal. The photodetection unit 9 may output a generated voltage signal as the light intensity signal Sc, or may convert the generated voltage signal into a digital signal and output the digital signal as the light intensity signal Sc. In a case where the light intensity signal Sc is a voltage signal, the signal is converted into a digital signal in the comparison unit 33. In addition, the photodetection unit 9 may include a phototube (for example, a biplanar phototube) instead of the photodiode.

Figure 2:
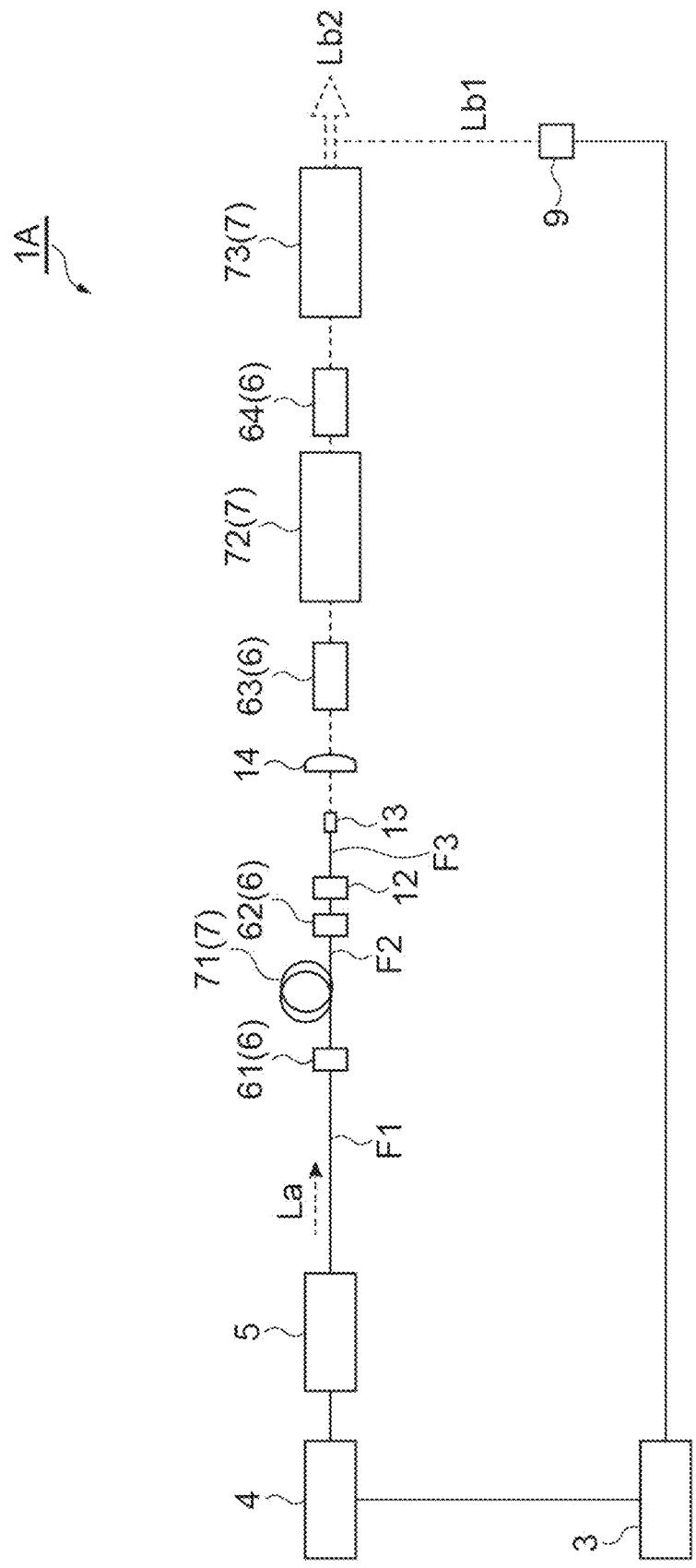
FIG. 2 is a block diagram illustrating a specific example of the laser apparatus 1A.

FIG. 2 is a block diagram illustrating a specific example of the laser apparatus 1A. In the specific example illustrated in FIG. 2, the laser apparatus 1A includes optical isolators 61, 62, 63, and 64 as the optical isolator 6 illustrated in FIG. 1, and an optical fiber amplifier 71 and solid-state laser amplifiers 72 and 73 as the optical amplifier 7. As described above, in this specific example, the optical amplifier 7 is configured in multiple stages. In addition, the laser apparatus 1A includes a bandpass filter 12, an optical fiber connector 13, and a collimator lens 14.

A light input end of the optical fiber amplifier 71 and the semiconductor laser element 5 are optically coupled via an optical fiber F1. The optical isolator 61 is interposed between the optical fiber amplifier 71 and the semiconductor laser element 5. The optical isolator 61 prevents the light (laser light La and excitation light) from returning from the optical fiber amplifier 71 to the semiconductor laser element 5. Thus, damage to the semiconductor laser element 5 can be prevented.

A light output end of the optical fiber amplifier 71 and the bandpass filter 12 are optically coupled via an optical fiber F2. The optical isolator 62 is interposed between the optical fiber amplifier 71 and the bandpass filter 12. The optical isolator 62 prevents light at a stage after the bandpass filter 12 from returning to the optical fiber amplifier 71.

The optical fiber amplifier 71 is a first-stage optical amplifier that amplifies the laser light La output from the semiconductor laser element 5. The gain of the optical fiber amplifier 71 is, for example, in the range of 20 to 30 dB. The bandpass filter 12 blocks a wavelength component of fluorescence contained in light output from the optical fiber amplifier 71. The bandpass filter 12 may include, for example, a dielectric multilayer film.

The bandpass filter 12 is optically coupled to the optical fiber connector 13 via an optical fiber F3. The optical fiber connector 13 terminates the optical fiber F3. That is, light that has passed through the bandpass filter 12 propagates through the optical fiber F3, reaches the optical fiber connector 13, and then is output to a space.

The collimator lens 14 is optically coupled to the optical fiber connector 13 via the space, and parallelizes (collimates) the light radially output from the optical fiber connector 13. Since an intensity of light amplified by the solid-state laser amplifiers 72 and 73 to be described later is high, the light is propagated in the space instead of in an optical fiber at a stage after the optical fiber connector 13 in order to avoid damage by the laser to an optical material such as glass. In addition, in FIG. 2, the light propagating in the space is illustrated by a dashed line.

The solid-state laser amplifier 72 is optically coupled to the collimator lens 14 via the optical isolator 63. The optical isolator 63 prevents light of the solid-state laser amplifier 72 from returning to a stage before the solid-state laser amplifier 72. Thus, damage to the optical fiber amplifier 71 can be prevented.

The solid-state laser amplifier 72 is a second-stage optical amplifier that further amplifies laser light after the amplification which is output from the optical fiber amplifier 71. The gain of the solid-state laser amplifier 72 is, for example, in the range of 3 to 20 dB.

The solid-state laser amplifier 73 is optically coupled to the solid-state laser amplifier 72 via the optical isolator 64. That is, the optical fiber amplifier 71 and the solid-state laser amplifiers 72 and 73 are coupled in series with each other. The optical isolator 64 prevents light of the solid-state laser amplifier 73 from returning to a stage before the solid-state laser amplifier 73. Thus, damage to the solid-state laser amplifier 72 can be prevented.

The solid-state laser amplifier 73 is a third-stage optical amplifier that further amplifies laser light after the amplification which is output from the solid-state laser amplifier 72. The gain of the solid-state laser amplifier 73 is, for example, in the range of 3 to 10 dB. The light amplified by the solid-state laser amplifier 73 is output as the laser light Lb after the amplification.

Figure 3:
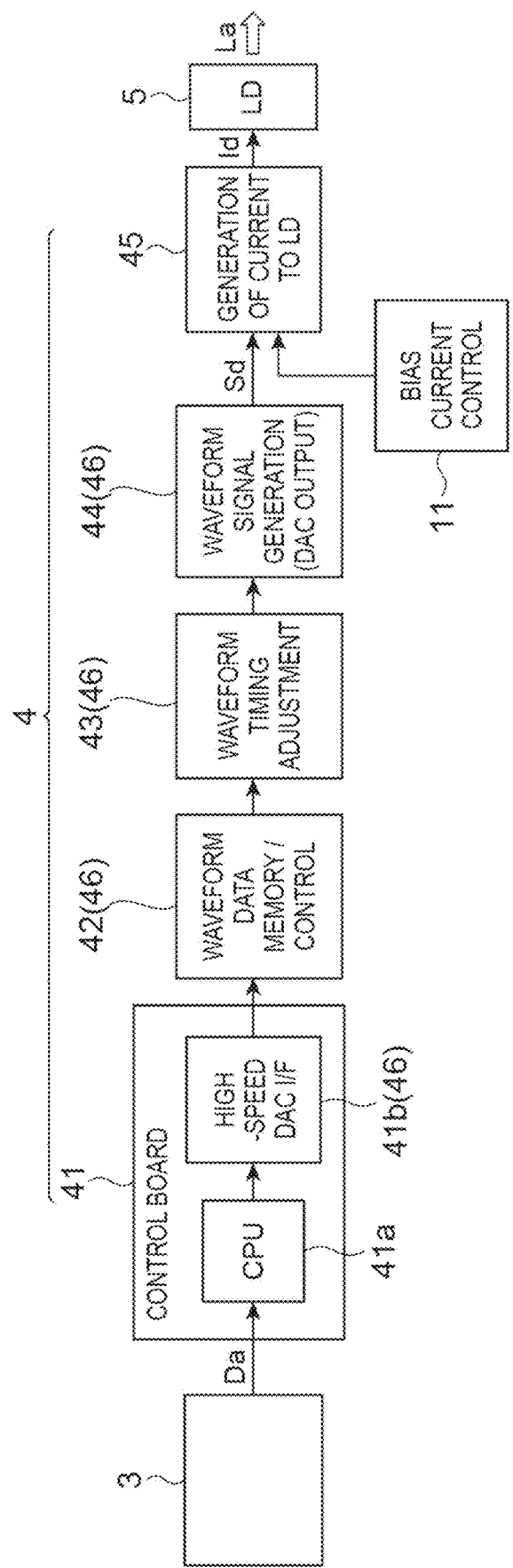
FIG. 3 is a block diagram illustrating a detailed configuration example of a driver circuit 4.

FIG. 3 is a block diagram illustrating a detailed configuration example of the driver circuit 4. As illustrated in FIG. 3, the driver circuit 4 includes a control board 41, a waveform data storage unit 42, a waveform timing adjustment unit 43, a waveform signal generation unit 44, and a current conversion unit 45. Further, the control board 41 is configured by including a CPU 41a and a high-speed DAC interface 41b. Of these, the high-speed DAC interface 41b, the waveform data storage unit 42, the waveform timing adjustment unit 43, and the waveform signal generation unit 44 constitute a D/A conversion unit 46. The D/A conversion unit 46 is an electronic circuit that converts the digital input waveform data Da into an analog drive signal Sd.

The control board 41 is a circuit board that serves as an interface with the waveform calculation unit 3. The CPU 41a is electrically connected to the waveform adjustment unit 32 (see FIG. 1) of the waveform calculation unit 3 via a communication line, and receives the input waveform data Da from the waveform adjustment unit 32. The CPU 41a transmits the input waveform data Da to the high-speed DAC interface 41b at an appropriate timing. The high-speed DAC interface 41b temporarily stores the input waveform data Da in the waveform data storage unit 42. The waveform data storage unit 42 is electrically connected to the high-speed DAC interface 41b, and includes, for example, a volatile storage element.

Figure 4:
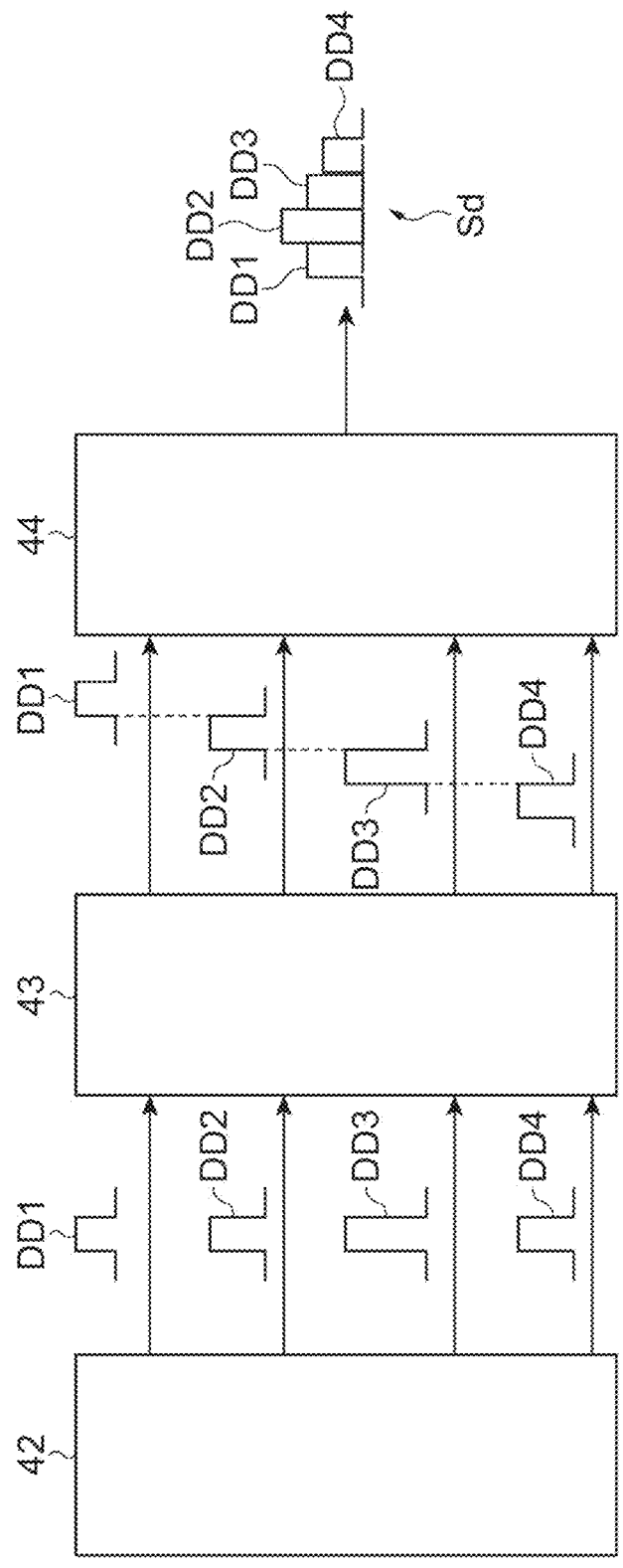
FIG. 4 is a diagram schematically illustrating a function of a waveform timing adjustment unit 43.

The waveform adjustment unit 32 of the present embodiment outputs the input waveform data Da as a plurality of continuous section waveform data formed by dividing a temporal waveform of the input waveform data Da (see FIG. 4). These section waveform data are output in parallel and simultaneously for every two or more section waveform data. Then, the waveform data storage unit 42 stores the plurality of section waveform data, and outputs the plurality of section waveform data according to a request.

The waveform timing adjustment unit 43 is electrically connected to the waveform data storage unit 42, and adjusts (controls) a timing at which the input waveform data Da is output from the waveform data storage unit 42. FIG. 4 is a diagram schematically illustrating a function of the waveform timing adjustment unit 43. As illustrated in FIG. 4, the waveform timing adjustment unit 43 sequentially outputs the plurality of section waveform data DD1 to DD4 read from the waveform data storage unit 42 while giving an appropriate time difference. In addition, the appropriate time difference is, for example, a time width of each section waveform data. The time width defines a time resolution of the output waveform, and is 1 nanosecond in one example.

The waveform signal generation unit 44 sequentially inputs the plurality of section waveform data DD1 to DD4 output from the waveform timing adjustment unit 43, and sequentially converts the section waveform data DD1 to DD4 into the drive signal Sd being an analog signal (voltage signal). At this time, a time difference between conversion timings of the section waveform data DD1 to DD4 substantially coincides with the time difference given by the waveform timing adjustment unit 43.

The current conversion unit 45 is electrically connected to the waveform signal generation unit 44, and converts the drive signal Sd into the drive current Id. That is, the current conversion unit 45 includes an analog circuit including a transistor, and converts the drive signal Sd being a voltage signal into the drive current Id being a current signal. The temporal waveform of the drive current Id generated at this time is substantially the same as the temporal waveform of the drive signal Sd.

In addition, the current conversion unit 45 is further connected to a bias current control unit 11. The bias current control unit 11 controls a magnitude of a bias component included in the drive current Id. The semiconductor laser element 5 is electrically connected to a current output end of the current conversion unit 45, receives the drive current Id from the current conversion unit 45, and outputs the laser light La. The temporal waveform of the laser light La is substantially the same as the temporal waveform of the drive current Id.

Figure 5:
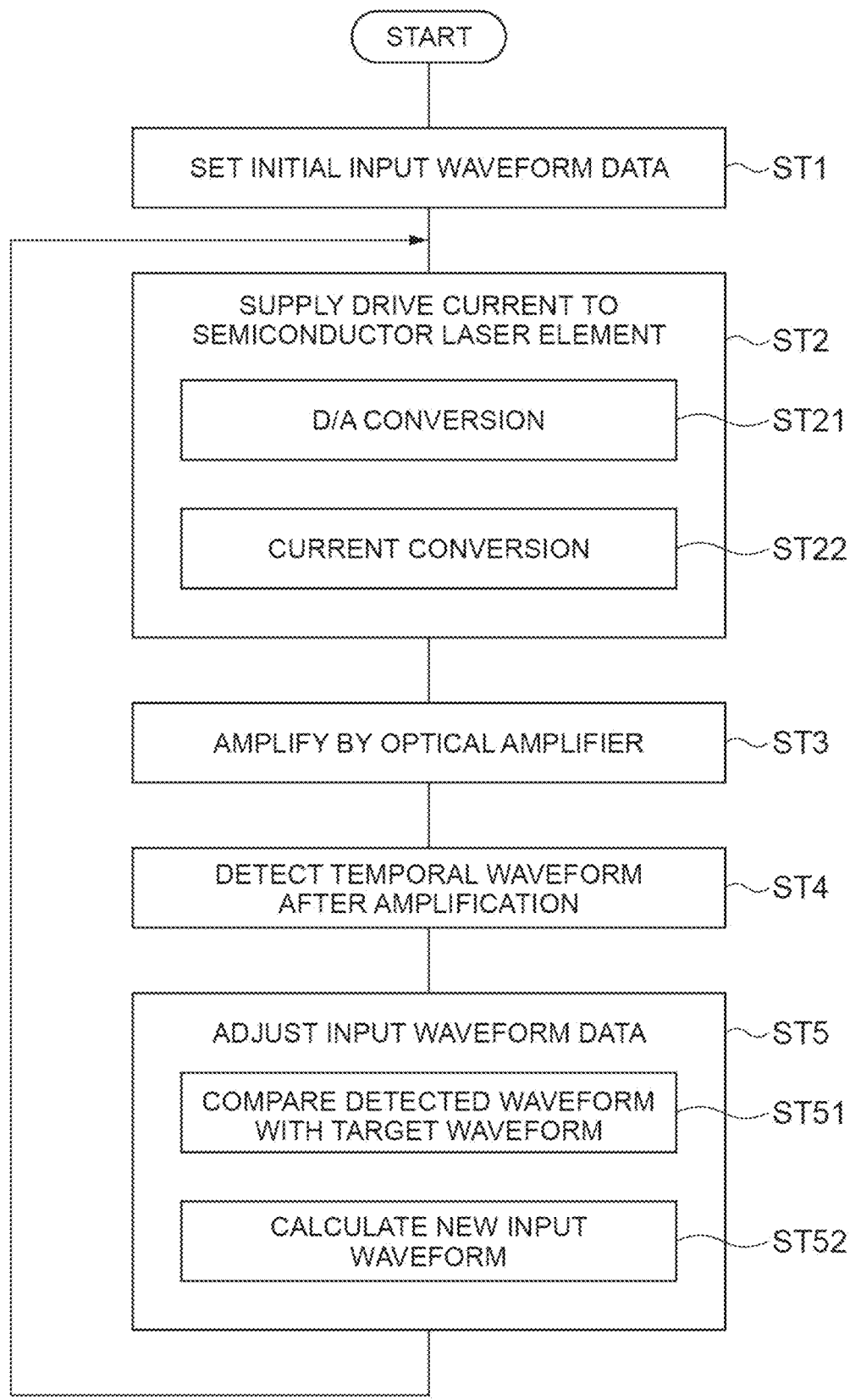
FIG. 5 is a flowchart illustrating an operation of the laser apparatus 1A.
Figure 6:
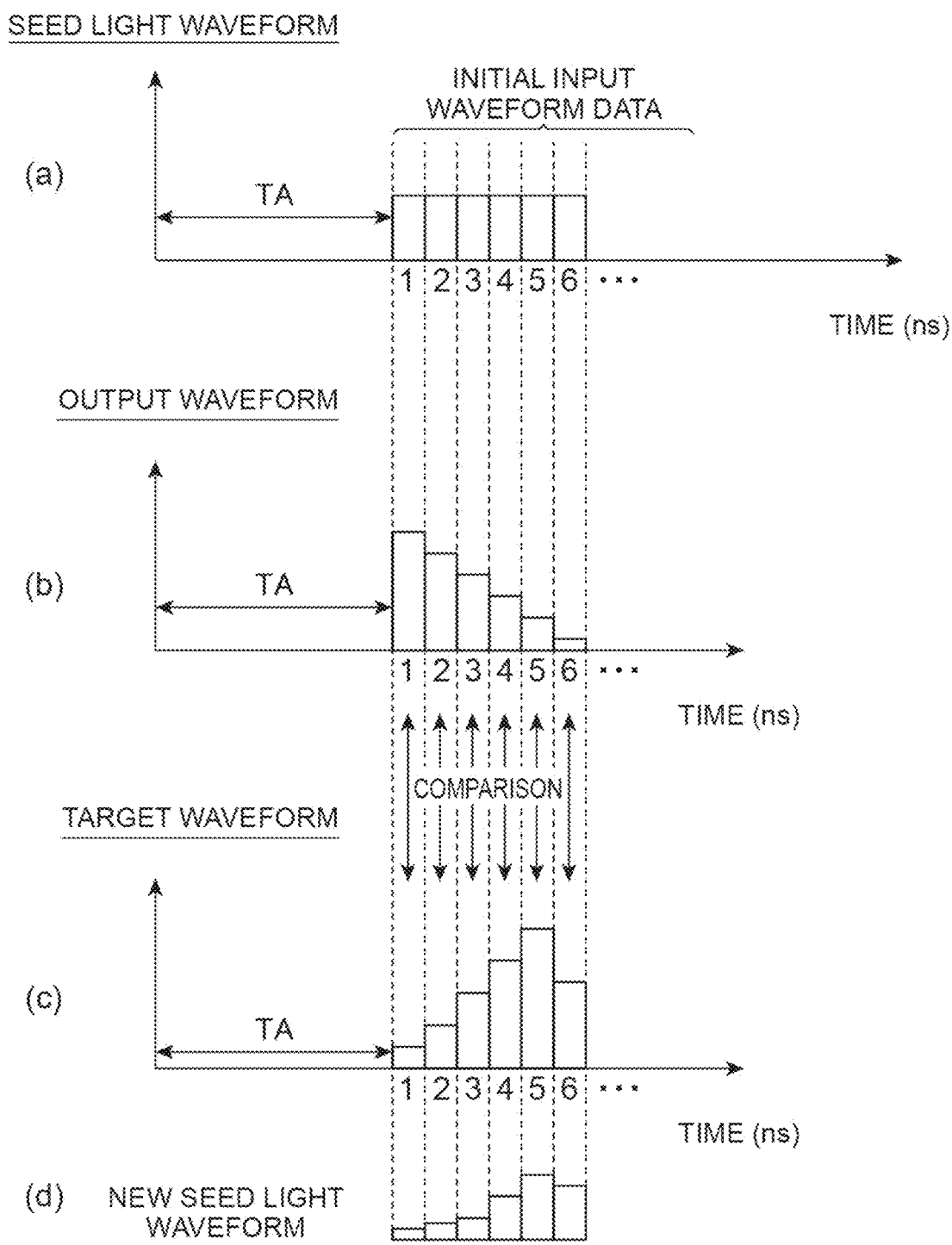
FIG. 6 includes (a) to (d) diagrams each schematically illustrating a light pulse waveform.

FIG. 5 is a flowchart illustrating an operation of the laser apparatus 1A. Further, (a) to (d) in FIG. 6 are diagrams each schematically illustrating a light pulse waveform. In these figures, the light pulse waveform is illustrated as a set of peak values (light intensities) of a plurality of continuous unit sections. Delay time TA is set as necessary, and a start point of the light pulse waveform is delayed by the delay time TA from reference time. In (a) to (d) in FIG. 6, the vertical axis represents a light intensity, and the horizontal axis represents time. The operation of the laser apparatus 1A and the laser waveform control method according to the present embodiment will be described with reference to FIG. 5 and FIG. 6.

First, the waveform adjustment unit 32 sets initial input waveform data Da (step ST1). The initial input waveform data Da is set on the basis of the target waveform data Db. In one example, the target waveform data Db is used as it is as the initial input waveform data Da. Next, the driver circuit 4 supplies the drive current Id to the semiconductor laser element 5 on the basis of the initial input waveform data Da, and the semiconductor laser element 5 outputs the laser light La (current supply step ST2). (a) in FIG. 6 schematically illustrates a temporal waveform of the laser light La generated on the basis of the initial input waveform data Da. The laser light La is amplified by the optical amplifier 7 (optical amplification step ST3).

In addition, the current supply step ST2 includes a D/A conversion step ST21 and a current conversion step ST22. In the D/A conversion step ST21, the D/A conversion unit 46 converts the digital input waveform data Da into the analog drive signal Sd. At this time, as described above, the plurality of continuous section waveform data DD1 to DD4 (see FIG. 4) formed by dividing the temporal waveform of the input waveform data Da are sequentially converted into the drive signal Sd while giving the time difference. In the current conversion step ST22, the current conversion unit 45 converts the drive signal Sd into the drive current Id.

Subsequently, the temporal waveform (output waveform) of the laser light Lb after the amplification is detected by the photodetection unit 9 (light waveform detection step ST4). (b) in FIG. 6 schematically illustrates the detected output waveform. In many cases, the temporal waveform of the laser light Lb after the amplification is different from the temporal waveform of the laser light La before the amplification. One of causes is that an excited state in the optical amplifier 7 changes with the passage of time. That is, immediately after the laser light La is incident, the optical amplifier 7 is strongly excited, and amplifies the laser light La with high gain. However, as time elapses from the start of the incident of the laser light La, an excitation intensity of the optical amplifier 7 gradually decreases, and the amplification gain of the laser light La also decreases accordingly.

Figure 7:
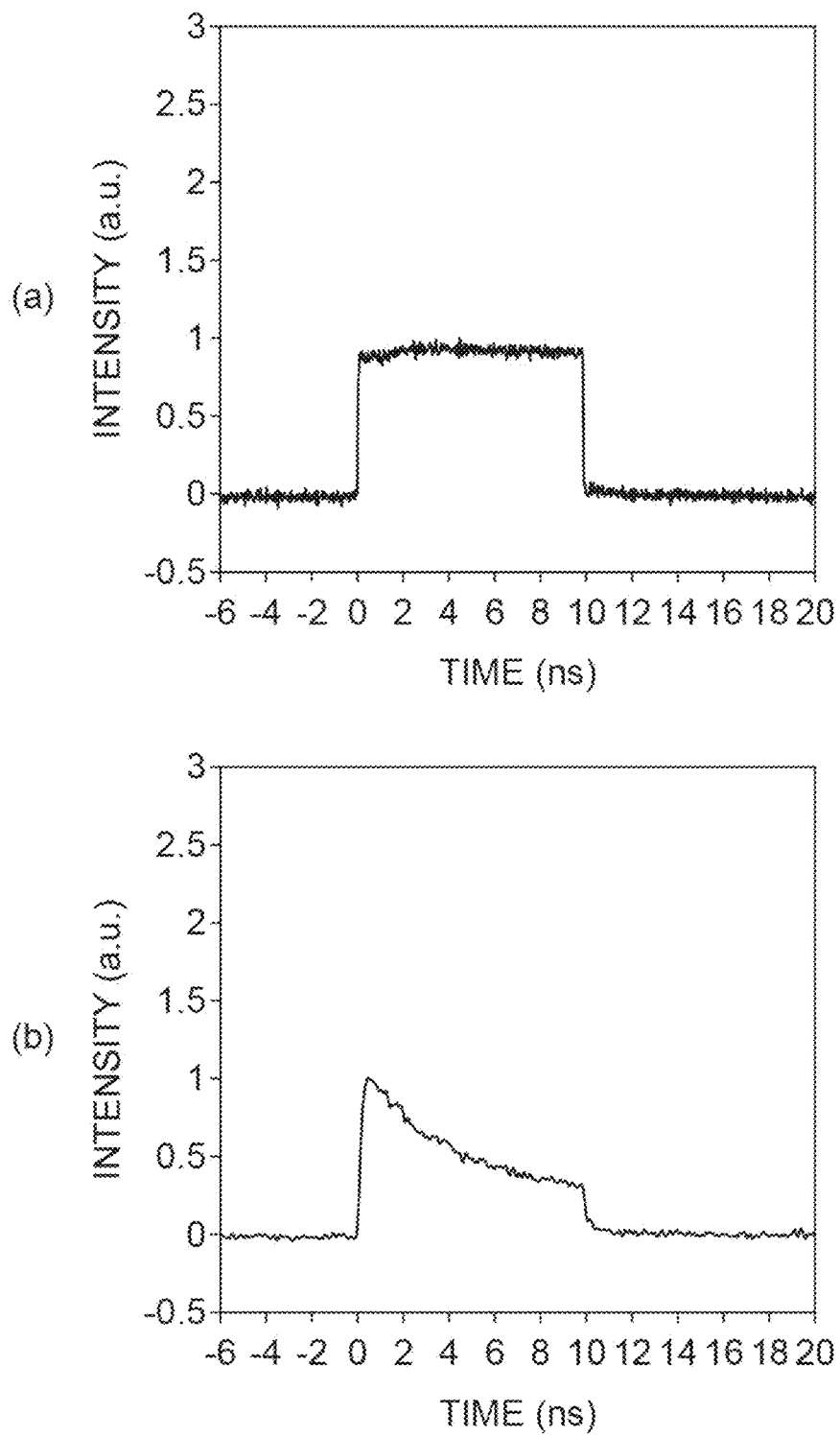
FIG. 7 includes (a) a graph showing a temporal waveform (rectangular wave) of laser light La before amplification, and (b) a graph showing a temporal waveform of laser light Lb after the laser light La having the temporal waveform shown in (a) is amplified.
Figure 8:
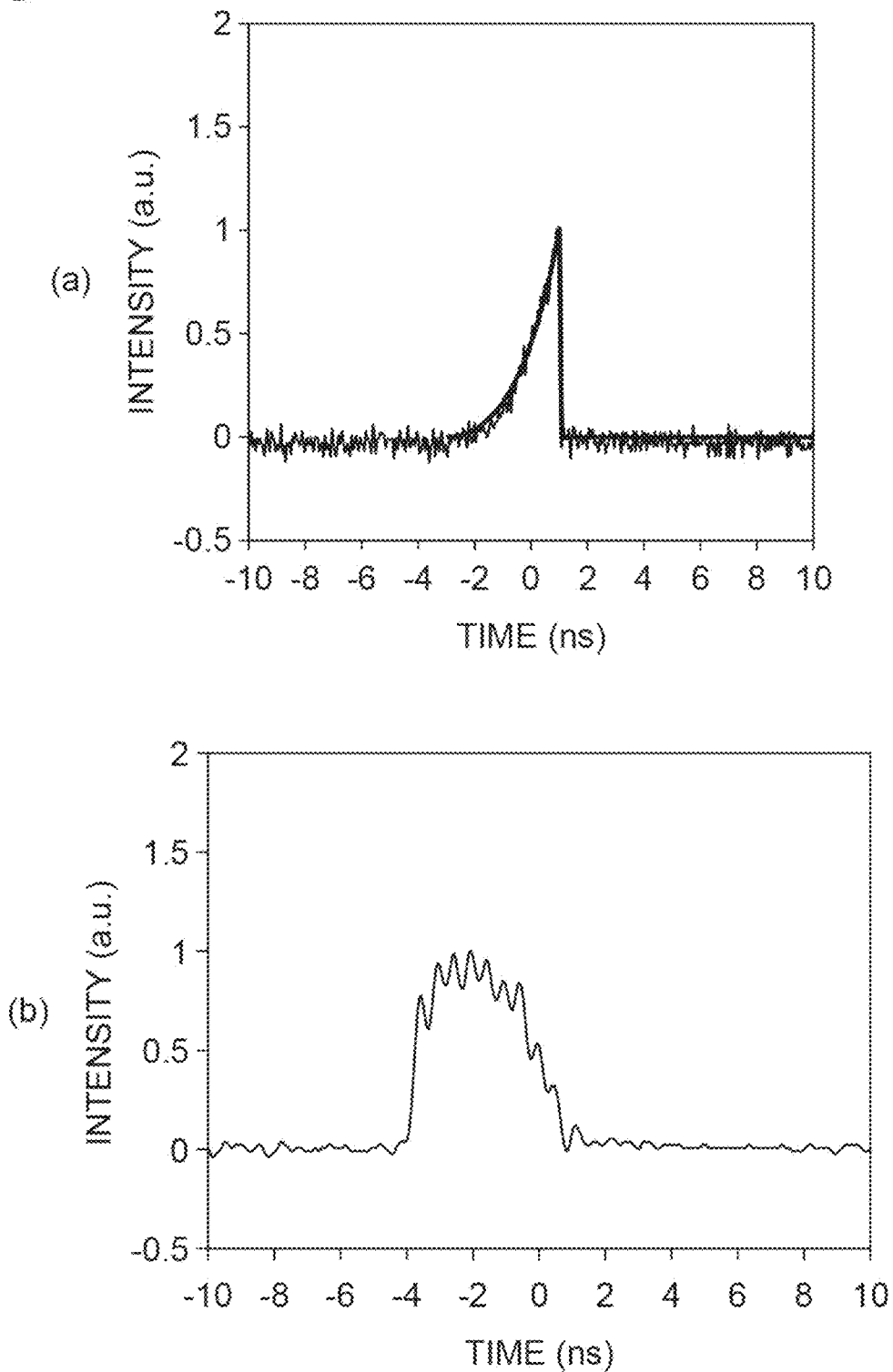
FIG. 8 includes (a) a graph showing a temporal waveform (ramp wave) of the laser light La before amplification, and (b) a graph showing a temporal waveform of the laser light Lb after the laser light La having the temporal waveform shown in (a) is amplified.

FIG. 7 and FIG. 8 include graphs respectively showing temporal waveforms of the laser light La before the amplification and the laser light Lb after the amplification, that are actually measured. (a) in FIG. 7 shows a temporal waveform (rectangular wave) of the laser light La before the amplification, and (b) in FIG. 7 shows a temporal waveform of the laser light Lb after the laser light La having the temporal waveform shown in (a) in FIG. 7 is amplified. Further, (a) in FIG. 8 shows a temporal waveform (ramp wave) of the laser light La before the amplification, and (b) in FIG. 8 shows a temporal waveform of the laser light Lb after the laser light La having the temporal waveform shown in (a) in FIG. 8 is amplified. In addition, the vertical axis represents a light intensity (arbitrary unit), and the horizontal axis represents time (unit: nanoseconds). As shown in these figures, the temporal waveform of the laser light Lb after the amplification is greatly different from the temporal waveform of the laser light La before the amplification.

FIG. 5 is referred again. In a waveform adjustment step ST5, first, the comparison unit 33 compares the detected output waveform with the target waveform represented by the target waveform data Db ((c) in FIG. 6), and outputs the difference (error) (step ST51). Next, the waveform adjustment unit 32 adjusts the temporal waveform of the input waveform data Da on the basis of the difference. That is, the waveform adjustment unit 32 calculates new input waveform data Da so that the difference becomes smaller (that is, the difference approaches 0) (step ST52).

The driver circuit 4 supplies the drive current Id to the semiconductor laser element 5 on the basis of the new input waveform data Da, and the semiconductor laser element 5 outputs the laser light La (current supply step ST2). (d) in FIG. 6 schematically illustrates a temporal waveform of the laser light La generated on the basis of the new input waveform data Da. The laser light La is amplified by the optical amplifier 7 (optical amplification step ST3). By repeating the above steps ST2 to ST5, the temporal waveform of the laser light Lb after the amplification approaches the target waveform. The laser light Lb generated in this way is output to the outside of the laser apparatus 1A.

Figure 11:
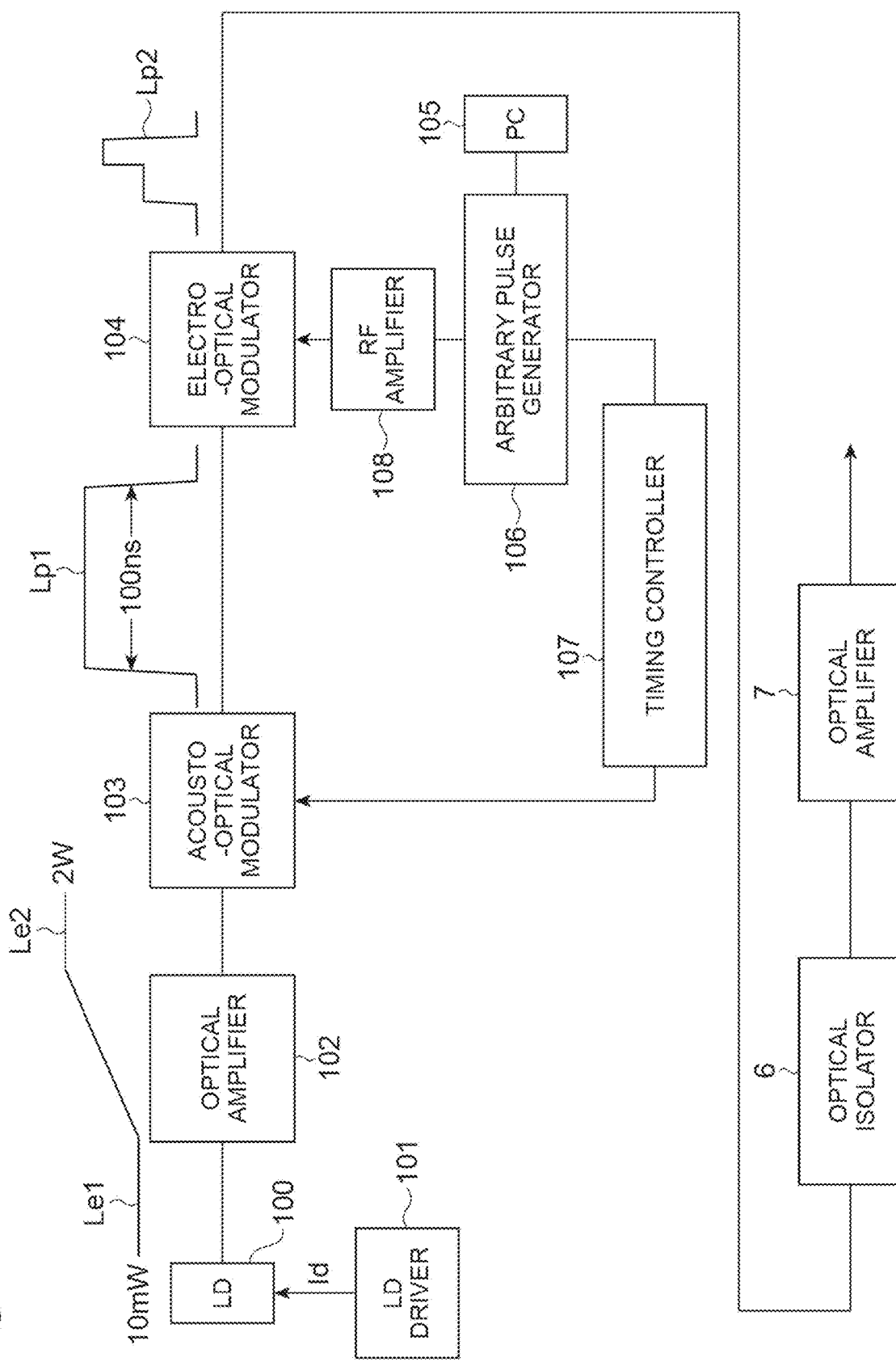
FIG. 11 is a block diagram illustrating a configuration of a conventional laser apparatus.

Effects obtained by the laser apparatus 1A and the laser waveform control method of the present embodiment having the above configuration will be described, together with problems of a conventional laser apparatus and control method. FIG. 11 is a block diagram illustrating a configuration of the conventional laser apparatus. The laser apparatus includes an optical isolator 6 and an optical amplifier 7. In addition, the laser apparatus includes a semiconductor laser element 100, a driver circuit 101, an optical amplifier 102, an acousto-optical modulator (AOM) 103, an electro-optical modulator (EOM) 104, a computer 105, an arbitrary pulse generator 106, a timing control unit 107, and an RF amplifier 108.

The driver circuit 101 supplies a drive current Id having a constant magnitude to the semiconductor laser element 100. The semiconductor laser element 100 outputs continuous light Le1 having a constant light intensity as a seed light source. The optical amplifier 102 is, for example, an optical fiber amplifier or a solid-state laser amplifier, and amplifies the continuous light Le1. A light intensity of the continuous light Le1 before the amplification is, for example, 10 mW, and a light intensity of the continuous light Le2 after the amplification is, for example, 2 W. The AOM 103 generates pulsed light Lp1 by defining a time width of the continuous light Le2 after the amplification. A time width of the pulsed light Lp1 is, for example, 100 nanoseconds.

The computer 105 stores target waveform data in advance, or generates target waveform data. The arbitrary pulse generator 106 receives the target waveform data from the computer 105, and generates a drive signal on the basis of the target waveform data. The arbitrary pulse generator 106 provides the drive signal to the RF amplifier 108. The timing control unit 107 synchronizes a timing at which the arbitrary pulse generator 106 provides the drive signal to the RF amplifier 108 and a timing at which the AOM 103 generates the pulsed light Lp1.

The RF amplifier 108 amplifies the drive signal and provides the amplified signal to the EOM 104. The EOM 104 is driven by the drive signal, adjusts a temporal waveform of the pulsed light Lp1 to a waveform according to the drive signal, and generates pulsed light Lp2. The EOM 104 is, for example, a lithium niobate (LN) modulator. The pulsed light Lp2 is sent to the optical amplifier 7 through the optical isolator 6. The optical amplifier 7 amplifies the pulsed light Lp2. The pulsed light Lp2 after the amplification is output to the outside of the laser apparatus.

Figure 12:
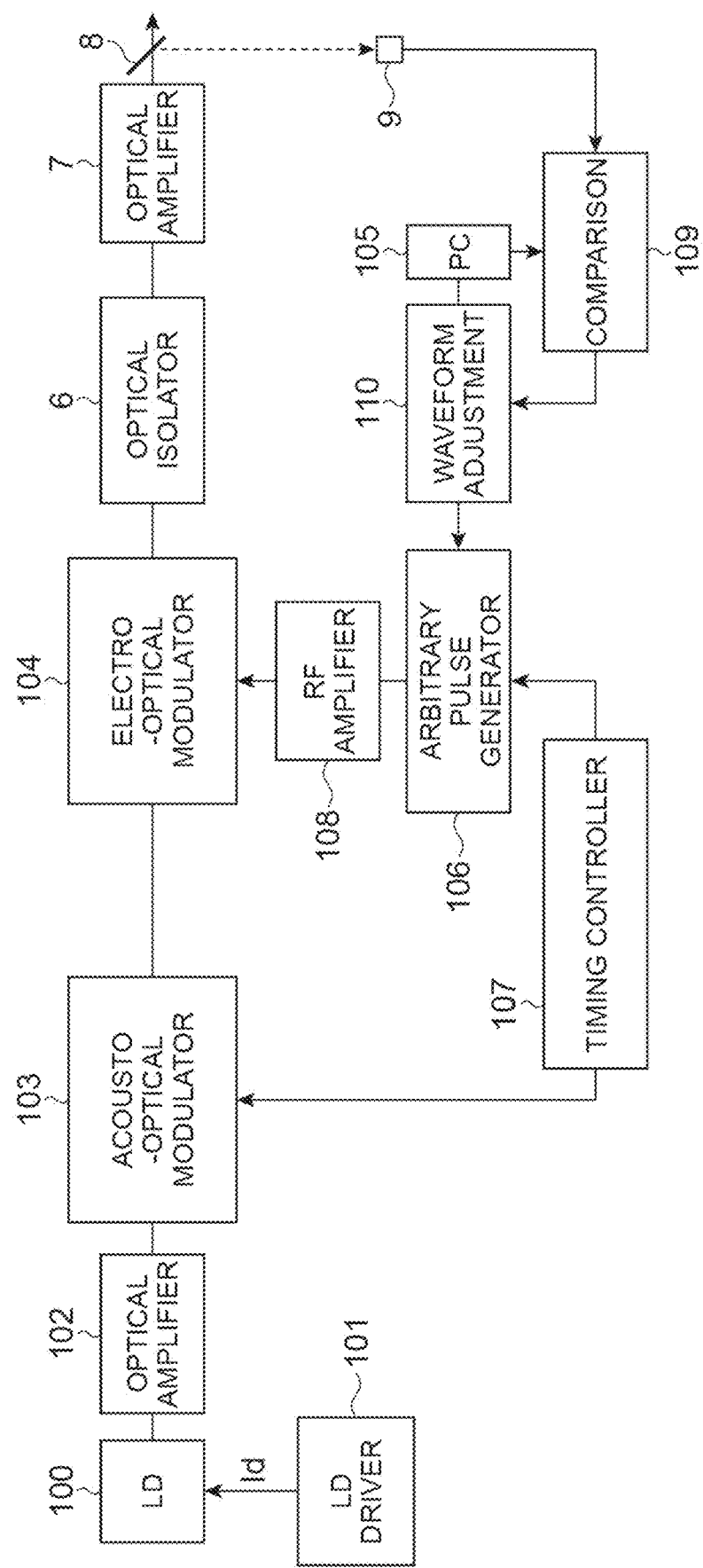
FIG. 12 is a block diagram illustrating a configuration in a case where a feedback circuit for adjusting a drive signal on the basis of an output waveform is added to the laser apparatus illustrated in FIG. 11.

FIG. 12 is a block diagram illustrating a configuration in a case where a feedback circuit for adjusting a drive signal on the basis of an output waveform is added to the laser apparatus illustrated in FIG. 11. The laser apparatus illustrated in FIG. 12 further includes an optical branch unit 8, a photodetection unit 9, a comparison unit 109, and a waveform adjustment unit 110, in addition to the elements illustrated in FIG. 11. The optical branch unit 8 branches a part of the pulsed light Lp2 after amplification by the optical amplifier 7. The photodetection unit 9 detects a light intensity of the branched part of the pulsed light Lp2. The comparison unit 109 compares the target waveform data output from the computer 105 with a temporal waveform of the detected pulsed light Lp2, and outputs a difference. The waveform adjustment unit 110 adjusts the drive signal so that the difference approaches 0.

In the laser apparatus illustrated in FIG. 11 and FIG. 12, the continuous light Le2 output from a fiber laser or a solid-state laser is shaped into an arbitrary waveform by the EOM 104. The sizes of the fiber laser and the solid-state laser tend to be large, and further, the EOM 104 has large fluctuations in characteristics (temperature drift) due to temperature changes, and thus, a configuration for compensating for the temperature drift of the EOM 104 is separately required. These are factors that hinder the size reduction of the laser apparatus.

In the present embodiment, a fiber laser or a solid-state laser that outputs continuous light is not used, and the semiconductor laser element 5 is used as a light source for amplification target light. Further, the temporal waveform of the drive signal Sd for driving the semiconductor laser element 5 is adjusted on the basis of the temporal waveform of the laser light Lb after the amplification detected by the light waveform detection unit 10 (light waveform detection step ST4). Thus, the temporal waveform of the laser light La output from the semiconductor laser element 5 can be adjusted so that the temporal waveform of the laser light Lb after the amplification approaches the target waveform.

Further, the sizes of an electronic circuit such as the waveform calculation unit 3 and the semiconductor laser element 5 are much smaller than the sizes of a fiber laser or a solid-state laser, and an EOM. In addition, as for the temperature drift of the semiconductor laser element 5, it is sufficient to keep the temperature of the semiconductor laser element 5 constant by a Peltier element or the like.

From the above, according to the present embodiment, it is possible to reduce an apparatus size as compared with a conventional apparatus and method. In an example of experimental equipment produced by the present inventors, in a case where the width and depth of the laser apparatus 1A of the present embodiment are substantially the same as the width and depth of the conventional apparatus, whereas the height of the conventional apparatus is 1500 mm, the height of the laser apparatus 1A of the embodiment is 88 mm that is much smaller than the height of the conventional apparatus.

Further, in a conventional method in which the continuous light Le2 is shaped by the EOM 104, the output waveform is shaped by adjusting light transmittance, however, it is difficult to make the light transmittance exactly 0, and a small light intensity remains even in a section where the light intensity is desired to be exactly 0. On the other hand, in the present embodiment, the output waveform is shaped by adjusting the temporal waveform of the drive signal Sd for driving the semiconductor laser element 5. Therefore, when the drive signal Sd is controlled so that the drive current Id is smaller than a threshold value, the laser light La is not output from the semiconductor laser element 5, and the light intensity can be easily made exactly 0.

Further, according to the method of the present embodiment in which the drive current Id to the semiconductor laser element 5 is shaped, the output waveform can be controlled with short time resolution, as compared with a method in which a light pulse waveform is shaped by use of the EOM 104.

Further, in the EOM 104, an input voltage (drive signal) and the light transmittance have a non-linear relationship with each other. Therefore, in the waveform adjustment unit 110, in addition to the change of the temporal waveform generated in the optical amplifier 7, a calculation for compensating the distortion of the temporal waveform in the EOM 104, a calibration table, or the like is required, which complicates calculations. On the other hand, in the present embodiment, since the light output intensity of the semiconductor laser element 5 and the drive current Id are in a substantially linear relationship with each other, a calculation in the waveform adjustment unit 32 is relatively easy.

Further, in the method in which a light pulse waveform is shaped by use of the EOM 104, the time width of the pulsed light Lp1 that can be output is limited to a short time such as 100 nanoseconds. On the other hand, in the present embodiment, since the semiconductor laser element 5 does not have such a time limit, it is possible to generate a light pulse for a longer time.

Figure 9:
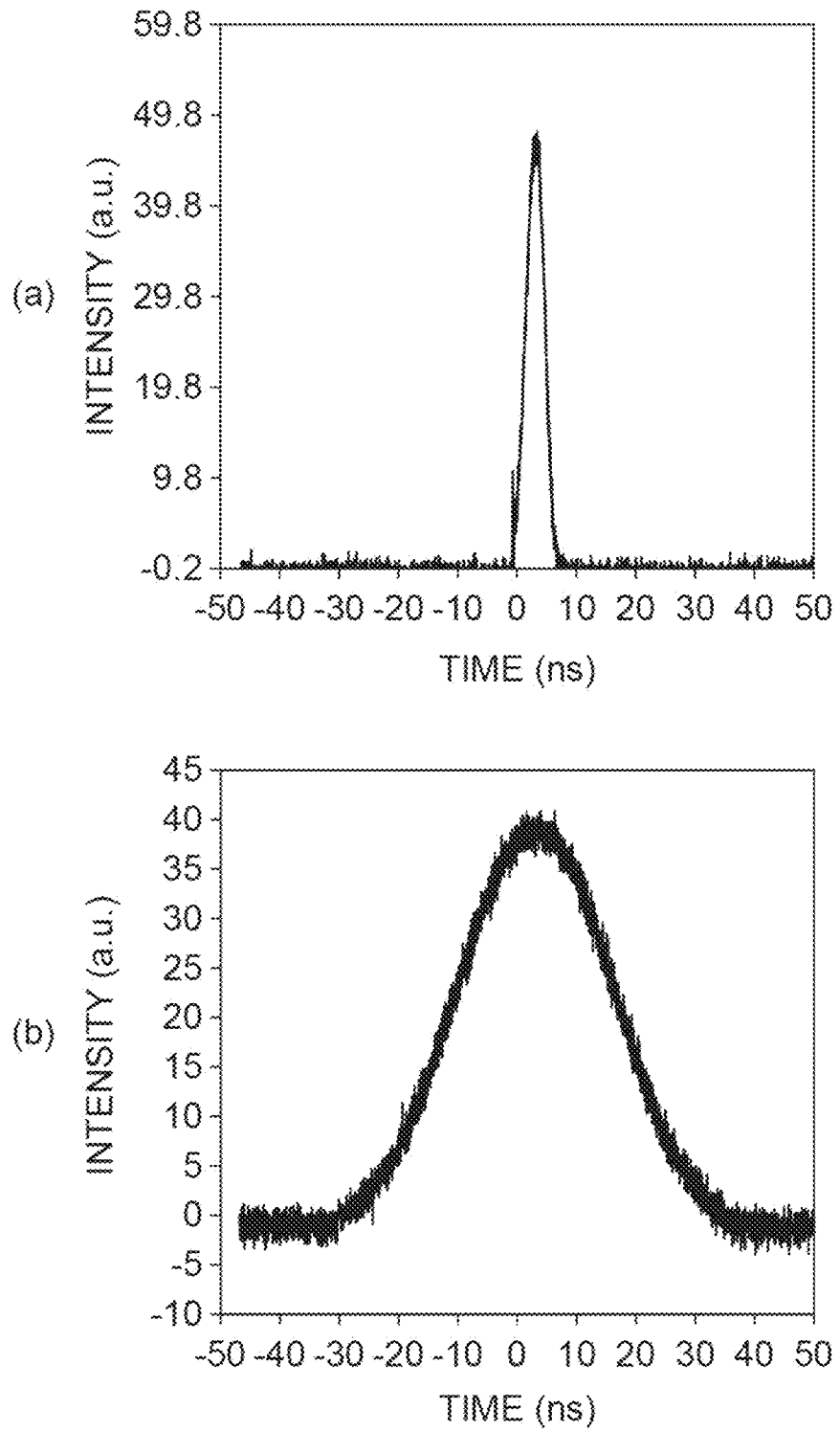
FIG. 9 includes graphs showing examples of a temporal waveform of the laser light La output from a semiconductor laser element 5, and shows (a) a Gaussian waveform with a full width at half maximum of 4 nanoseconds, and (b) a Gaussian waveform with a full width at half maximum of 32 nanoseconds.
Figure 10:
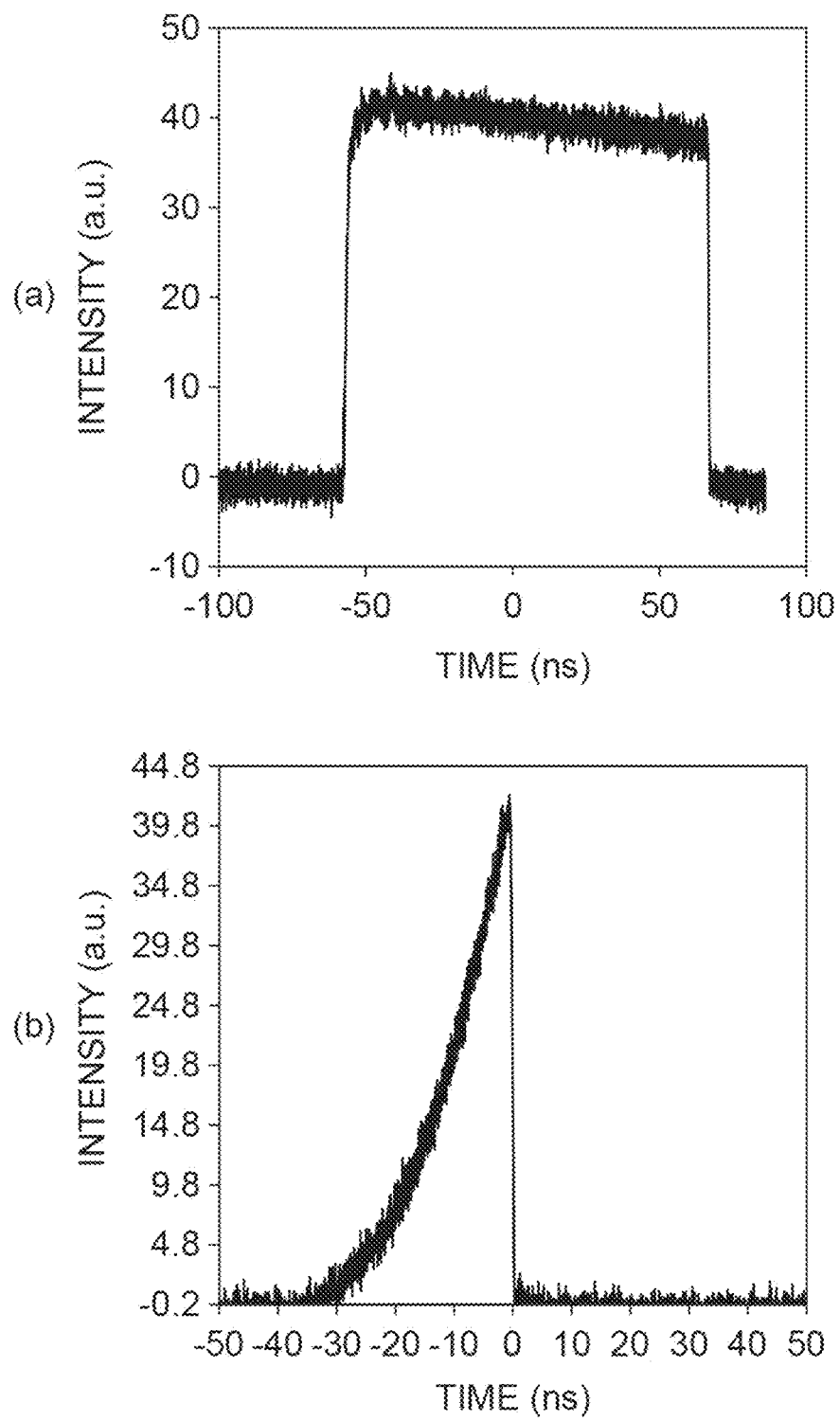
FIG. 10 includes graphs showing examples of a temporal waveform of the laser light La output from the semiconductor laser element 5, and shows (a) a rectangular wave with a full width at half maximum of 120 nanoseconds, and (b) a ramp waveform with a full width at half maximum of 4 nanoseconds.

FIG. 9 and FIG. 10 include graphs showing examples of the temporal waveform of the laser light La output from the semiconductor laser element 5. In addition, the vertical axis represents a light intensity (arbitrary unit), and the horizontal axis represents time (unit: nanoseconds). (a) in FIG. 9 shows a Gaussian waveform with a full width at half maximum of 4 nanoseconds. (b) in FIG. 9 shows a Gaussian waveform with a full width at half maximum of 32 nanoseconds. (a) in FIG. 10 shows a rectangular wave with a full width at half maximum of 120 nanoseconds. (b) in FIG. 10 shows a ramp waveform with a full width at half maximum of 4 nanoseconds. As described above, according to the laser apparatus 1A of the present embodiment, it is possible to generate any various temporal waveforms.

Further, as in the present embodiment, in the waveform calculation unit 3 (in waveform adjustment step ST5), the temporal waveform of the input waveform data Da may be adjusted so that the difference between the temporal waveform of the laser light Lb after the amplification which is detected by the light waveform detection unit 10 and the target waveform approaches 0. Thus, the temporal waveform after the amplification can be brought close to the target waveform with higher accuracy. In this case, the waveform calculation unit 3 may have a storage unit (memory of the computer 31) that stores data representing the target waveform in advance.

Further, as in the present embodiment, the driver circuit 4 (current supply step ST2) may include the D/A conversion unit 46 (D/A conversion step ST21) that converts the digital input waveform data Da into the analog drive signal Sd, and the current conversion unit 45 (current conversion step ST22) that converts the drive signal Sd into the drive current Id. Further, the D/A conversion unit 46 (D/A conversion step ST21) may sequentially convert the plurality of continuous section waveform data DD1 to DD4 formed by dividing the temporal waveform of the input waveform data Da into the drive signal Sd while giving the time difference. Thus, the drive signal Sd can be made high-speed and the time resolution of the output waveform can be improved.

The laser apparatus and the laser waveform control method according to the present invention are not limited to the above embodiments and configuration examples, and various other modifications are possible. For example, in the above embodiment, the target waveform data is stored in the waveform calculation unit 3, but the target waveform data may be input from the outside of the laser apparatus 1A. Further, the optical isolator 6 may be omitted if necessary.

The laser apparatus of the above embodiment is configured to include a semiconductor laser element; a waveform calculation unit for calculating input waveform data; a driver circuit electrically connected to the waveform calculation unit and the semiconductor laser element, and for generating a drive current having a temporal waveform according to the input waveform data, and supplying the drive current to the semiconductor laser element; an optical amplifier optically coupled to the semiconductor laser element, and for amplifying light output from the semiconductor laser element; and a light waveform detection unit for detecting a light waveform after the amplification output from the optical amplifier, and the waveform calculation unit compares the light waveform after the amplification detected by the light waveform detection unit with a target waveform, adjusts a temporal waveform of the input waveform data, and brings the light waveform after the amplification close to the target waveform.

The laser waveform control method of the above embodiment is configured to include a current supply step of generating a drive current having a temporal waveform according to input waveform data, and supplying the drive current to a semiconductor laser element; an optical amplification step of amplifying light output from the semiconductor laser element; a light waveform detection step of detecting a light waveform after the amplification; and a waveform adjustment step of comparing the light waveform after the amplification detected by the light waveform detection step with a target waveform, adjusting a temporal waveform of the input waveform data, and bringing the light waveform after the amplification close to the target waveform.

In the above laser apparatus, the waveform calculation unit may adjust the temporal waveform of the input waveform data so that a difference between the light waveform after the amplification detected by the light waveform detection unit and the target waveform approaches 0.

Further, in the above laser waveform control method, the waveform adjustment step may adjust the temporal waveform of the input waveform data so that a difference between the light waveform after the amplification detected by the light waveform detection step and the target waveform approaches 0.

According to the above configuration, the light waveform after the amplification can be brought close to the target waveform with higher accuracy. Further, in this case, in the laser apparatus, the waveform calculation unit may include a storage unit for storing data representing the target waveform in advance.

In the above laser apparatus, the driver circuit may include a D/A conversion unit for converting the digital input waveform data into an analog drive signal; and a current conversion unit for converting the drive signal into the drive current, and the D/A conversion unit sequentially converts a plurality of continuous section waveform data formed by dividing the temporal waveform of the input waveform data into the drive signal while giving a time difference.

Further, in the above laser waveform control method, the current supply step may include a D/A conversion step of converting the digital input waveform data into an analog drive signal; and a current conversion step of converting the drive signal into the drive current, and the D/A conversion step sequentially converts a plurality of continuous section waveform data formed by dividing the temporal waveform of the input waveform data into the drive signal while giving a time difference.

According to the above configuration, the drive signal can be made high-speed and the time resolution of the light waveform can be improved.

INDUSTRIAL APPLICABILITY

The present invention can be used as a laser apparatus and a laser waveform control method capable of reducing an apparatus size.

REFERENCE SIGNS LIST

1A—laser apparatus, 3—waveform calculation unit, 4—driver circuit, 5—semiconductor laser element, 6—optical isolator, 7—optical amplifier, 8—optical branch unit, 9—photodetection unit, 10—light waveform detection unit, 11—bias current control unit, 12—bandpass filter, 13—optical fiber connector, 14—collimator lens, 31—computer, 32—waveform adjustment unit, 33—comparison unit, 41—control board, 41a—CPU, 41b—high-speed DAC interface, 42—waveform data storage unit, 43—waveform timing adjustment unit, 44—waveform signal generation unit, 45—current conversion unit, 46—D/A conversion unit, 61, 62, 63, 64—optical isolator, 71—optical fiber amplifier, 72, 73—solid-state laser amplifier, Da—input waveform data, Db—target waveform data, Dc—difference data, DD1—DD4—section waveform data, F1-F3—optical fiber, Id—drive current, La, Lb—laser light, Sc—light intensity signal, Sd—drive signal, TA—delay time.

The invention claimed is:

1. A laser apparatus comprising:
a semiconductor laser element being a single laser diode;
a waveform calculation unit configured to calculate input waveform data;
a driver circuit electrically connected to the waveform calculation unit and the semiconductor laser element, and configured to generate a drive current having a temporal waveform according to the input waveform data, and supply the drive current to the single laser diode of the semiconductor laser element;
an optical amplifier optically coupled to the semiconductor laser element, and configured to amplify light output from the semiconductor laser element; and
a light waveform detection unit configured to detect a light waveform after the amplification output from the optical amplifier, wherein
the waveform calculation unit is configured to compare the light waveform after the amplification detected by the light waveform detection unit with a target waveform to generate difference data, adjust the temporal waveform of the drive current by adjusting a temporal waveform of the input waveform data based on the target waveform and the difference data, and adjust a light waveform output from the semiconductor laser element only by the drive current having the temporal waveform adjusted by the input waveform data to bring the light waveform after the amplification close to the target waveform, and
the waveform calculation unit is configured to adjust the temporal waveform of the input waveform data so that a difference between the light waveform after the amplification detected by the light waveform detection unit and the target waveform approaches 0.

2. The laser apparatus according to claim 1, wherein the waveform calculation unit includes a storage unit configured to store data representing the target waveform in advance.

3. The laser apparatus according to claim 1, wherein the driver circuit includes:
a D/A conversion unit configured to convert the digital input waveform data into an analog drive signal; and
a current conversion unit configured to convert the drive signal into the drive current, wherein
the D/A conversion unit is configured to sequentially convert a plurality of continuous section waveform data formed by dividing the temporal waveform of the input waveform data into the drive signal while giving a time difference.

4. A laser waveform control method comprising:
a current supply step of generating a drive current having a temporal waveform according to input waveform data prepared for a semiconductor laser element being a single laser diode, and supplying the drive current to the single laser diode of the semiconductor laser element;
an optical amplification step of amplifying light output from the semiconductor laser element;
a light waveform detection step of detecting a light waveform after the amplification; and
a waveform adjustment step of comparing the light waveform after the amplification detected by the light waveform detection step with a target waveform to generate difference data, adjusting the temporal waveform of the drive current by adjusting a temporal waveform of the input waveform data based on the target waveform and the difference data, and adjusting a light waveform output from the semiconductor laser element only by the drive current having the temporal waveform adjusted by the input waveform data to bring the light waveform after the amplification close to the target waveform, wherein the waveform adjustment step adjusts the temporal waveform of the input waveform data so that a difference between the light waveform after the amplification detected by the light waveform detection step and the target waveform approaches 0.

5. The laser waveform control method according to claim 4, wherein the current supply step includes:
   a D/A conversion step of converting the digital input waveform data into an analog drive signal; and
   a current conversion step of converting the drive signal into the drive current, wherein
   the D/A conversion step sequentially converts a plurality of continuous section waveform data formed by dividing the temporal waveform of the input waveform data into the drive signal while giving a time difference.

* * * * *